(12) United States Patent
Yamada et al.

(10) Patent No.: US 8,134,283 B2
(45) Date of Patent: Mar. 13, 2012

(54) VIBRATING ELEMENT AND VIBRATOR

(75) Inventors: Akinori Yamada, Ina (JP); Katsuo Ishikawa, Tatsuno-Machi (JP); Shuhei Yoshida, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 104 days.

(21) Appl. No.: 12/706,451

(22) Filed: Feb. 16, 2010

(65) Prior Publication Data
US 2010/0207486 A1 Aug. 19, 2010

(30) Foreign Application Priority Data

Feb. 17, 2009 (JP) ................................. 2009-033578

(51) Int. Cl.
*H01L 41/04* (2006.01)
(52) U.S. Cl. ....................................... 310/346; 310/370
(58) Field of Classification Search .................. 310/346, 310/370
See application file for complete search history.

(56) References Cited

U.S. PATENT DOCUMENTS

| 6,768,247 | B2 * | 7/2004 | Kitamura et al. | 310/370 |
| 7,193,354 | B2 * | 3/2007 | Kawashima | 310/370 |
| 7,279,824 | B2 | 10/2007 | Tanaya et al. | |

FOREIGN PATENT DOCUMENTS

| JP | A-54-40589 | 3/1979 |
| JP | A-2005-136499 | 5/2005 |

OTHER PUBLICATIONS

Street, R.; "Elasticity and Anelasticity of Chromium," Physical Review Letters, Mar. 15, 1963, vol. 10, No. 6, pp. 210-211.
McMorrow, D. et al; "Magnetism in Metals," The Royal Danish Academy of Sciences and Letters, 1997, Matematisk-fysiske Meddelelser, 45.

* cited by examiner

*Primary Examiner* — Derek Rosenau
(74) *Attorney, Agent, or Firm* — Oliff & Berridge, PLC

(57) ABSTRACT

A vibrating element includes: a vibrating body having frequency temperature dependency; and a temperature characteristic correcting part provided on a surface of the vibrating body. The temperature characteristic correcting part has a temperature characteristic of at least one of a Young's modulus and a thermal expansion coefficient and is expressed by a temperature characteristic curve which has at least one of an inflection point and an extremal value. In the vibrating element, a temperature of at least one of the inflection point and the extremal value is within an operating temperature range of the vibrating body.

10 Claims, 8 Drawing Sheets

Au/Cr=500/1500 Å

Au/Cr=500/2000 Å

Au/Cr=500/2500 Å

VIBRATING ELEMENT AND VIBRATOR

BACKGROUND

1. Technical Field

The present invention relates to a vibrating element and a vibrator including the vibrating element. Especially, the present invention relates to a vibrating element and a vibrator having a favorable frequency temperature characteristic.

2. Related Art

In vibrating bodies having frequency temperature dependency, improving a frequency temperature characteristic has been a long-term issue. Especially, in terms of flexural vibrating elements made of quartz crystal which has a frequency temperature characteristic expressed by a quadratic curve, various techniques for improving the frequency temperature characteristic are disclosed.

JP-A-54-40589 as a first example discloses a technique about a tuning fork type vibrating element. In the first example, a bending direction of a vibrating arm is set in two directions on XY' plane and Y'Z' plane, and two kinds of flexural vibrations are generated by one flexural vibrating element. The vibrating element combines these vibrations to improve a frequency temperature characteristic of one of the vibrations.

JP-A-2005-136499 as a second example discloses a technique about a tuning fork type vibrating element as well. In the second example, a film thickness of a contact metal of Cr formed as an under layer of Au and Ag is increased in a predetermined range, so that stress generated on a Cr forming part influences on a vibration characteristic so as to improve a frequency temperature characteristic.

According to the above examples, the frequency temperature characteristic is improved. However, the technique of the first example is combining two kinds of vibration, so that it is difficult to control each of the two kinds of vibration advantageously.

Further, the technique of the second example does not clearly show a factor of improvement of the frequency temperature characteristics, so that further improvement of the temperature characteristic can not be secured advantageously.

SUMMARY

An advantage of the present invention is to provide a vibrating element exhibits a more excellent frequency temperature characteristic than related art and a vibrator including the vibrating element. In the invention, a factor that the frequency temperature characteristic is improved depending on change of a film thickness of a metal film is traced and the change of the frequency temperature characteristic corresponding to the change of the film thickness is utilized so as to obtain the excellent frequency temperature characteristic.

The invention intends to solve at least part of the above problem, and can be realized by the following aspects.

A vibrating element includes: a vibrating body having frequency temperature dependency; and a temperature characteristic correcting part provided on a surface of the vibrating body. The temperature characteristic correcting part has a temperature characteristic of at least one of a Young's modulus and a thermal expansion coefficient and is expressed by a temperature characteristic curve which has at least one of an inflection point and an extremal value. In the vibrating element, a temperature of at least one of the inflection point and the extremal value is within an operating temperature range of the vibrating body.

Accordingly, a vibrating element which utilizes the frequency temperature characteristic change associated with film thickness change so as to have a better frequency temperature characteristic than related art.

In the vibrating element of the aspect, the temperature of at least one of the inflection point and the extremal value may be a Neel temperature.

A Neel temperature is a temperature at which an antiferromagnetic material turns into a paramagnetic material, so that an extremal value of a Young's modulus is obtained. Thus the frequency temperature characteristic can be securely improved.

In the vibrating element of the aspect, the temperature characteristic correcting part may be made of one of Cr and a Cr alloy.

Since Cr has been conventionally used as a contact metal, a manufacturing process of the vibrating element is subject to less load.

In the vibrating element of the aspect, the vibrating body may include two kinds of the temperature characteristic correcting parts that have different temperatures of at least one of the inflection point and the extremal value from each other.

Accordingly, the vibrating element can obtain a correcting effect of the frequency temperature characteristic at a temperature at the inflection point or the extremal value of each of the temperature characteristic correcting parts. Consequently, the frequency temperature characteristic can be further improved.

In the vibrating element of the aspect, the temperature difference may be generated by a difference of thickness of metal films constituting the temperature correcting parts.

Accordingly, the vibrating element can obtain a temperature characteristic correcting effect in two temperature ranges even though the vibrating element has the temperature characteristic correcting parts made of one material. Consequently, the vibrating element can obtain a large correcting effect of the frequency temperature characteristic.

In the vibrating element of the aspect, the temperature characteristic correcting parts may be made of one of an alloy and a metal mainly contained in the alloy, and the temperature difference may be generated by one of difference between a content rate of mainly-contained metal of the alloy and a content rate of other metal and difference between a thickness of the alloy and a thickness of the mainly contained metal of the alloy.

The vibrating element can obtain the temperature characteristic correcting effect in two temperature ranges. Consequently, the vibrating element can obtain a large correcting effect of the frequency temperature characteristic.

In the vibrating element of the aspect, one vibrating body may be bonded to an upper surface of the temperature characteristic correcting part formed on a surface of the other vibrating body so as to sandwich the temperature characteristic correcting part by two pieces of temperature characteristic correcting parts.

In such the vibrating element, the temperature characteristic correcting part is not exposed to the outside, so shat deterioration with age and the like of the frequency temperature characteristic can be suppressed.

In the vibrating element of the aspect, main vibration of the vibrating body may be flexural vibration.

The flexural vibration generates distortion on an excitation electrode forming plane in an extensional direction or a compressive direction, providing a large correcting effect of the frequency temperature characteristic associated with an effect of film stress.

In the vibrating element of the aspect, main vibration of the vibrating body may be contour vibration.

The contour vibration also generates extensional distortion and compressive distortion on the excitation electrode or distortion due to sliding movement, providing a large correcting effect of the frequency temperature characteristic associated with the effect of the film stress.

In the vibrating element of the aspect, an insulation film may be interposed between the vibrating body and the temperature characteristic correcting part.

Even in the vibrating element structured as this, compressive stress or extensional stress generated at a temperature at the inflection point or the extremal value of the Young's modulus or the thermal extension coefficient influences on a surface of the vibrating body. Consequently, the vibrating element can obtain a correcting effect of the frequency temperature characteristic.

A vibrator according to a second aspect of the invention includes: the vibrating element according to the first aspect and a package in which the vibrating element is mounted.

Accordingly, a vibrator having an excellent frequency temperature characteristic in a large temperature range so as to be highly reliable can be obtained.

BRIEF DESCRIPTION OF THE DRAWINGS

The invention will be described with reference to the accompanying drawings, wherein like numbers reference like elements.

FIG. 2A show a case where a film thickness of the temperature characteristic correcting part made of Cr is set to be 1500 Å. FIG. 2B shows a case where the film thickness is set to be 2000 Å. FIG. 2C shows a case where the film thickness is set to be 2500 Å.

DESCRIPTION OF EXEMPLARY EMBODIMENTS

A vibrating element and a vibrator according to embodiments of the present invention will be described below in detail with reference to accompanying drawings.

First Embodiment

Figure 1A:
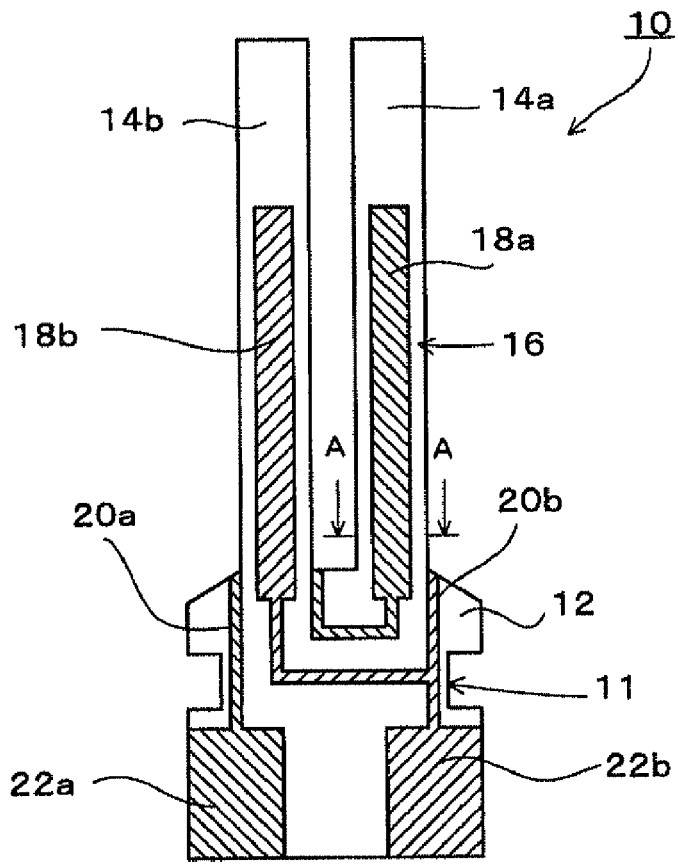
FIG. 1A is a plan view showing a vibrating element according to a first embodiment.
Figure 1B:
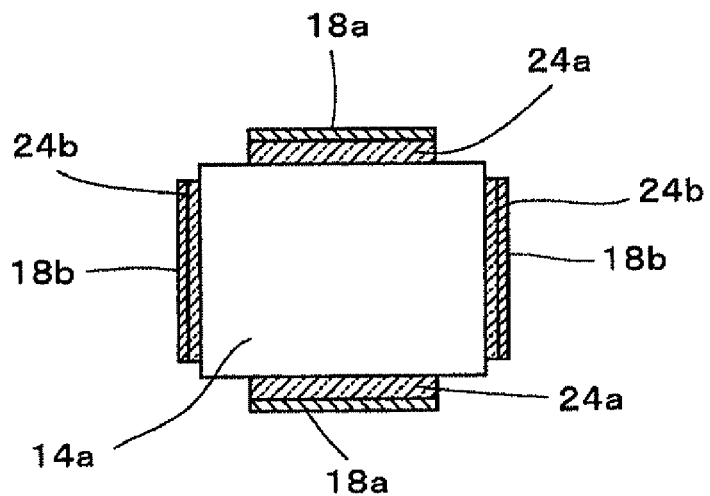
FIG. 1B is a sectional view taken along an A-A line of FIG. 1A.

A vibrating element according to a first embodiment of the invention will now be described with reference to FIGS. 1A and 1B. FIG. 1A is a plan view of the vibrating element and FIG. 1B is a sectional view taken along an A-A line of FIG. 1A.

As a vibrating element 10 according to the first embodiment, an element chip which is made of quartz crystal and constitutes a vibrating body having frequency temperature dependency will be exemplified. A tuning fork type vibrating element of which main vibration is flexural vibration will be described as an example.

The vibrating element 10 according to the first embodiment is composed of a vibrating body 11 and a metal film 16 formed on the vibrating body 11. The vibrating body 11 is made of quartz crystal exhibiting a piezoelectric effect, and the vibrating body 11 includes a base 12 and a pair of vibrating arms 14a and 14b extending from the base 12, thus having a tuning fork type shape. The metal film 16 is composed of temperature characteristic correcting parts 24a and 24b serving as a base layer and an electrode part serving as a surface layer. The electrode part includes excitation electrodes 18a and 18b for exciting vibration, input output electrodes 22a and 22b for inputting and outputting a drive signal and a detection signal, and extracted electrodes 20a and 20b for connecting the excitation electrodes 18a and 18b with the input output electrodes 22a and 22b.

In the first embodiment, the temperature characteristic correcting parts 24a and 24b are made of chrome (Cr) and the electrode part is made of gold (Au). Cr has favorable adhesiveness with respect to quartz crystal used as the vibrating body 11 so as to be superior as a contact metal. Gold (Au) has extremely low electric resistance, exhibits stability, and is hardly oxidized, for example, so as to have small characteristic change caused by aged deterioration.

Figure 2A:
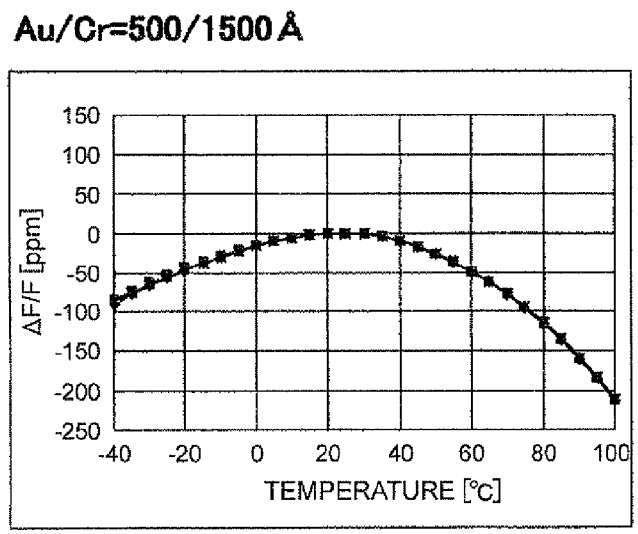
FIGS. 2A to 2C are graphs showing a frequency temperature characteristic of a vibrator.
Figure 2B:
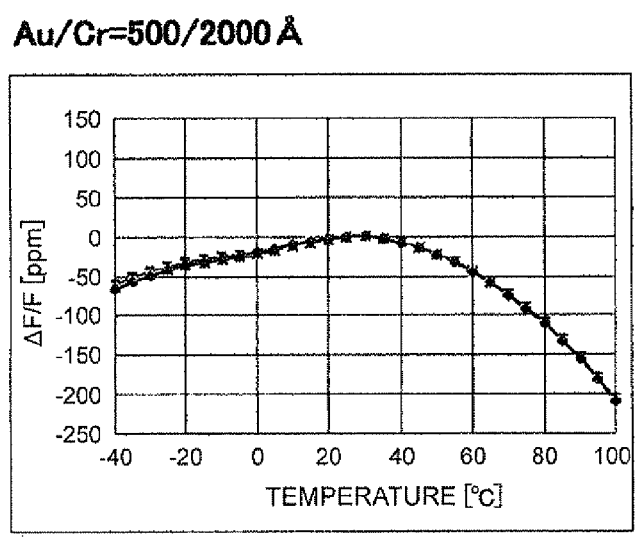
Figure 2C:
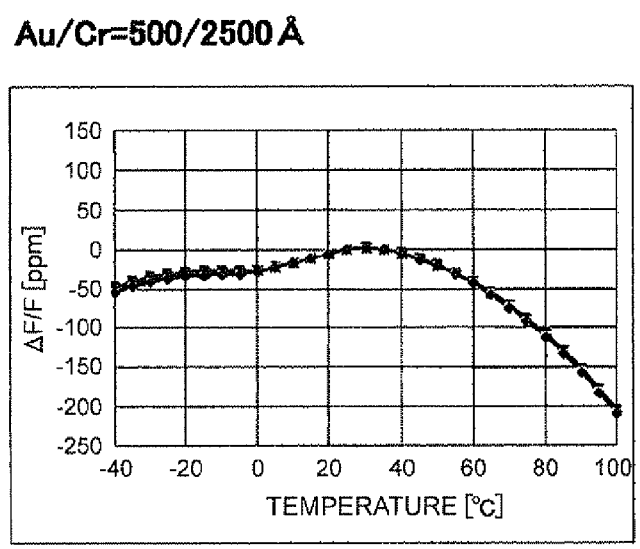

FIGS. 2A to 2C obtained by an experiment also show the function of Cr of which the temperature characteristic correcting parts 24a and 24b are made. FIGS. 2A to 2C show how a frequency temperature characteristic of a vibrator changes in the experiment when a film thickness of Au is set to be constant (500 Å) and a film thickness of Cr is changed as 1500 Å(FIG. 2A), 2000 Å(FIG. 2B), and 2500 Å(FIG. 2C). In the change of the frequency temperature characteristic, as the film thickness of Cr is increased, a frequency fluctuating amount becomes small at a left side of a peak temperature, that is, at a lower temperature side of the peak temperature.

Here, the resonance frequency of the vibrator can be calculated from elements such as a length of a vibrating part of the vibrating body 11, a width of the same, a thickness of the same, density of substance constituting the vibrating body 11, a boundary condition, and an elastic constant. A factor that the resonance frequency of the vibrator changes due to change of the film thickness of the metal film formed on the vibrating part is an elastic constant. Among elements constituting the elastic constant, a Young's modulus and a thermal expansion coefficient are sited as a factor that the resonance frequency of the vibrator fluctuates due to temperature change. Therefore, it is considerable that temperature dependency of the resonance frequency of the vibrator is caused by change of a Young's modulus and a thermal expansion coefficient as well.

Hereinafter, improvement of the frequency temperature characteristic, corresponding to change of the film thickness of Cr, at the lower temperature side will be considered.

Figure 3:
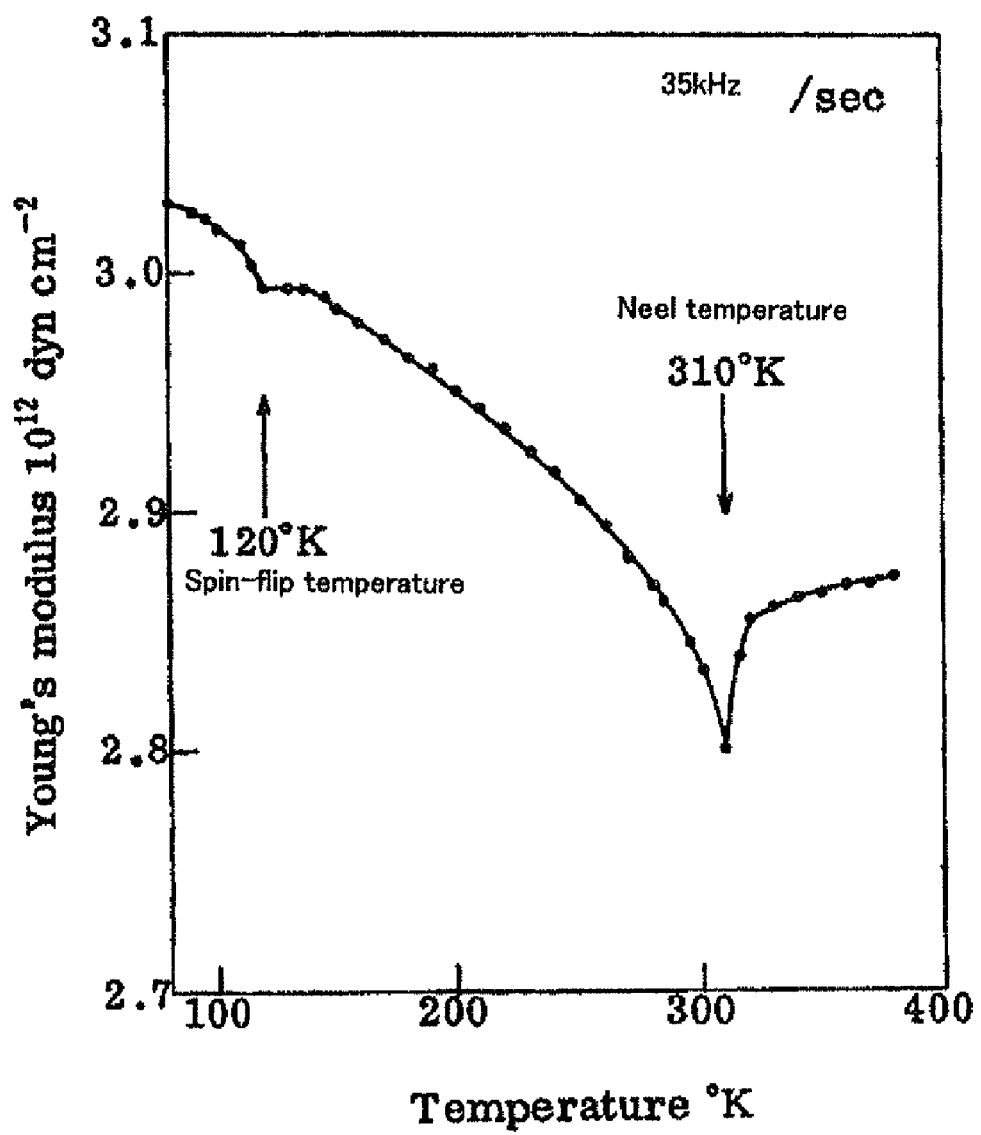
FIG. 3 is a graph showing a relation between change of a Young's modulus of Cr and a temperature.

FIG. 3 is a graph showing change of a Young's modulus of solid Cr. FIG. 3 is a reference cited from "R. Street, Elasticity and Anelasticity of Chromium, Physical Review Letters, Vol. 10, No. 6, 1963 pp. 210-211." Referring to FIG. 3, the Young's modulus sharply changes at 120K (spin-flip temperature: a temperature at which a Young's modulus is at an inflection point) and 310K (Neel temperature: a temperature at which a Young's modulus is at an extremal value). Here, a Young's modulus of Cr has an inflection point at a spin-flip temperature of 120K and has an extremal value at a Neel temperature of 310K.

120K is −153° C. and 310K is +37° C. Therefore, when an operating temperature range of the vibrator is set to be from −55° C. to +125° C., more preferably from −40° C. to +85° C., the Neel temperature of Cr is in the operating temperature range of the vibrator. Here, a Neel temperature is a temperature at which an antiferromagnetic material turns to a paramagnetic material. Further, antiferromagnetism is a magnetic property having no magnetic moments due to neighboring spins pointing in opposite directions to each other. Paramagnetism is a magnetic property which is not magnetized in absence of an externally applied magnetic field, and is weakly magnetized in a presence of an applied magnetic field. That is, it is considerable that rapid change of the Young's modulus occurs in accordance with a state transition of a magnetic material.

It is known that when a paramagnetic material turns to be an antiferromagnetic material at the Neel temperature, magnetic moment disappears so as to cause large volume change. Therefore, it is considerable that the thermal expansion coefficient also changes at the Neel temperature of the antiferromagnetic material.

It is known that the Neel temperature of Cr changes in response to change of compressive stress and extensile stress caused by film thickness change. Namely, the Neel temperature of thinned Cr film compared to solid Cr shifts to the lower temperature side in a range of several dozen degrees (° C.). However, from FIGS. 2A to 2C, it seems that there is no improvement of the frequency fluctuation amount in FIG. 2A and an improvement effect of the frequency fluctuation amount is increased as the film thickness is increased as shown in FIGS. 2B and 2C. This means that the Neel temperature shifts to the higher temperature side by increasing the film thickness of the thinned Cr film. That is, it is considerable that the Neel temperature rapidly shifts to the lower temperature side lower than the operating temperature range of the vibrator when the film thickness of Cr is set to be 1500 Å or less.

Figure 4:
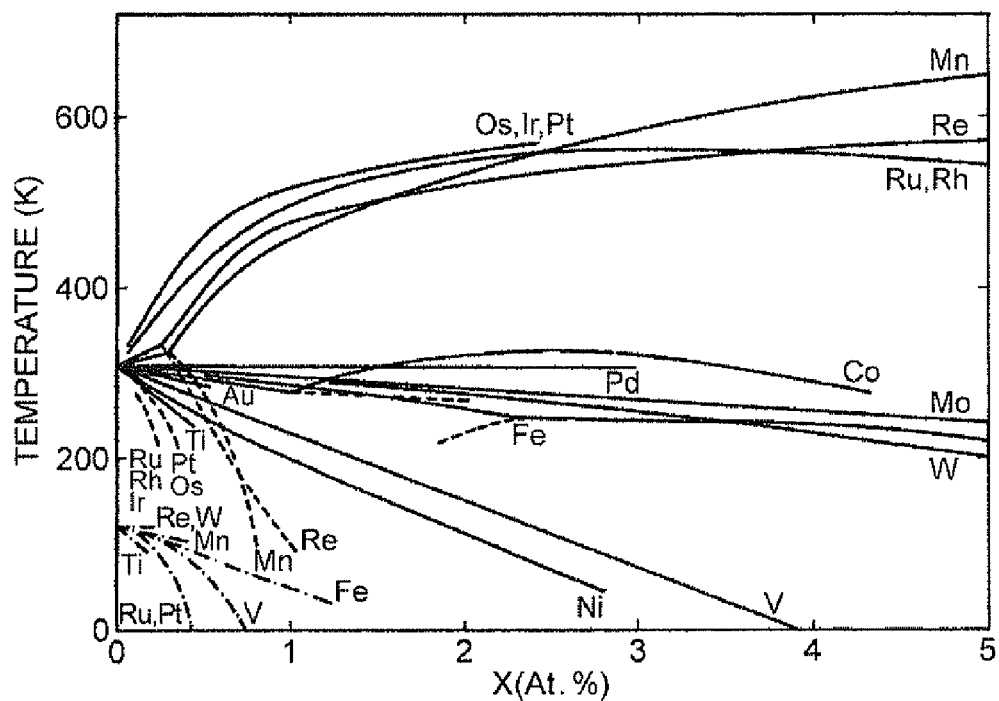
FIG. 4 is a graph showing a relation between change of a Neel temperature of Cr and a content rate of metal in alloying.

In addition, the rapid decrease of the Neel temperature corresponding to thinning of Cr is caused by the following phenomenon as well. Here, there is an alloy layer in which Au is dispersed in Cr between Cr and Au, that is, between the temperature characteristic correcting part 24a and the electrode part (the excitation electrode 18a in FIG. 1B) and between the temperature characteristic correcting part 24b and the electrode part (the excitation electrode 18b in FIG. 1B). Referring to FIG. 4 which shows change of the Neel temperature which changes in a manner corresponding to alloying of Cr, it is understood that increase of Au content rate causes decrease of the Neel temperature of Cr. FIG. 4 is a reference cited from "D. F. McMorrow, J. Jensen, H. M. Ronnow, "Magnetism in Metals", Mat. Fys. Medd. Dan. Vid. Selsk, 45 (1997)."

That is, in a case where the thickness of the Cr film is small, a rate of dispersed Au, namely, a content rate of Au in the alloy layer is high, so that the Neel temperature is lowered more largely than a case where a Cr film is simply thinned. In a case where the thickness of the Cr film is large, the content rate of Au is decreased and a layer which is not alloyed is also generated, raising the Neel temperature. Therefore, it is considerable that the Neel temperature became around 0 C.° when the film thickness of Cr was set to be 2500 Å. From the above experiment, when the film thickness of Cr is set to be 2000 Å or more, Cr exhibits a function as the temperature characteristic correcting part, that is, exhibits a frequency temperature characteristic improving effect.

From the above points, it is understood that a temperature at which the Young's modulus becomes extremal value (the Neel temperature in the case of Cr) changes depending on change of the film thickness or alloying in the temperature characteristic correcting parts 24a and 24b. Accordingly, in the vibrating element 10 according to the first embodiment, the temperature characteristic correcting parts 24a on a front surface and a rear surface of the vibrating arms 14a and 14b have different film thickness from the temperature characteristic correcting parts 24b on lateral surfaces of the arms 14a and 14b, on the metal film 16 on which a potential changes in applying voltage as shown in FIG. 1B.

Structured as this, one vibrating body 11 includes two (two kinds of) temperature characteristic correcting parts 24a and 24b that have different Neel temperatures from each other. Accordingly, the frequency characteristic is improved at each of the Neel temperatures of the temperature characteristic correcting parts 24a and 24b. Consequently, the frequency fluctuation amount in the operating temperature range is smaller than a case correcting by one kind of temperature characteristic correcting part, being able to make a curve showing the frequency temperature characteristic flatter.

Further, the invention has clarified the factor improving the frequency temperature characteristic, enabling an analysis of a vibration characteristic by simulation and developing-cost reduction.

Second Embodiment

Figure 5:
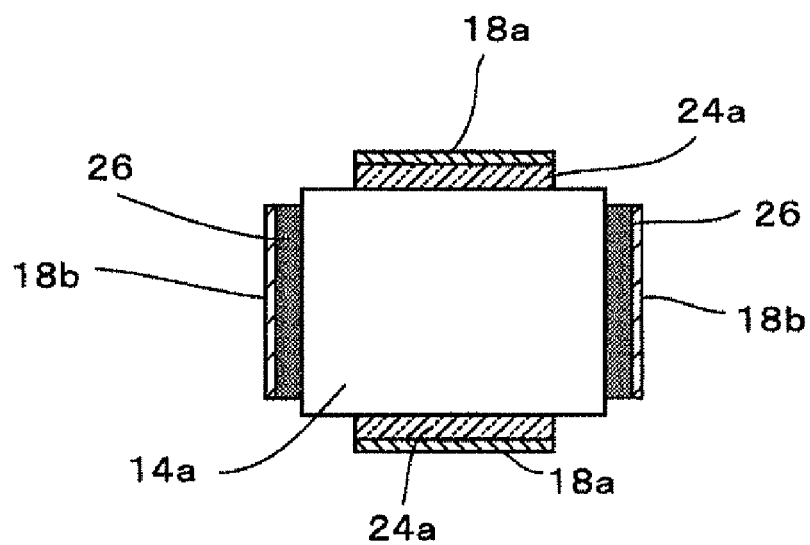
FIG. 5 is a diagram showing a structure of a vibrating arm which is a characteristic part of a vibrating element according to a second embodiment.

A vibrating element according to a second embodiment will now be described with reference to FIG. 5. A structure of the vibrating element according to the present embodiment is mostly same as that of the vibrating element according to the first embodiment described above. Therefore, elements having the same functions as those of the first embodiment are given the same reference numerals in the drawing and the descriptions thereof are not repeated. For the whole structure of the vibrating element, FIGS. 1A and 1B are referred.

The vibrating element 10 according to the second embodiment is provided with the temperature characteristic correcting part 24a and a temperature characteristic correcting part 26 that are made of different kinds of metals from each other and serve as base layers of an electrode part having different potentials on a bending part.

Here, the two kinds of temperature characteristic correcting parts 24a and 26 preferably have extremal values of a Young's modulus which are respectively at the higher temperature side and at the lower temperature side of the peak temperature of the frequency temperature characteristic of the vibrator. In terms of Cr, according to the first embodiment, of which the temperature characteristic correcting part is made, the Neel temperature which is the extremal value of the Young's modulus is at the lower temperature side of the peak temperature of the frequency temperature characteristic. Therefore, the frequency temperature characteristic is entirely improved at the lower temperature side of the peak temperature. Accordingly, it is considerable that the frequency temperature characteristic can be improved also at the higher temperature side of the peak temperature of the frequency temperature characteristic by using a material, having a Young's modulus of which an extremal value is at the higher temperature side of the peak temperature, as one material of the temperature characteristic correcting parts.

Concretely, in a case where the temperature characteristic correcting part 24a constituting the base layer of the excitation electrode 18a and formed on each of the front and rear surfaces of the vibrating arm 14a is made of Cr, the temperature characteristic correcting part 26 constituting the base layer of the excitation electrode 18b an formed on the lateral surfaces of the vibrating arm 14a is made of chromium dioxide ($CrO_2$).

Here, $CrO_2$ is a ferromagnetic material, so that a temperature at which a Young's modulus is an extremal value is called Curie temperature. Here, the Curie temperature is a temperature at which a ferromagnetic material turns to a paramagnetic material. The Curie temperature of $CrO_2$ is 386K (113° C.) so as to be at the higher temperature side of the peak temperature (about 30° C.) of the frequency temperature characteristic shown in FIGS. 2A to 2C. When the operating temperature range of the vibrator is set to be from −55° C. to +125° C., the Curie temperature is in the range. When the temperature characteristic correcting parts 24a and 26 are made of the above-mentioned materials, the frequency fluctuation amount can be decreased at both of the higher temperature side and the lower temperature side of the peak temperature of the frequency temperature characteristic. Thus the frequency temperature characteristic can be improved in the whole of the operating temperature range.

Here, in a case where a temperature range in which the frequency temperature characteristic is improved is widened toward the lower side by adjusting the film thickness or alloying with Au, the Curie temperature of $CrO_2$ can be set in the operating temperature range of −40° C. to +85° C.

Further, the two kinds of temperature characteristic correcting parts 24a and 26 of the embodiment may be respectively made of alloys mainly containing Cr in different content rates from each other. This is because a temperature at which the Young's modulus is an extremal value changes depending on a content rate of metal as shown in FIG. 4.

Third Embodiment

Figure 6:
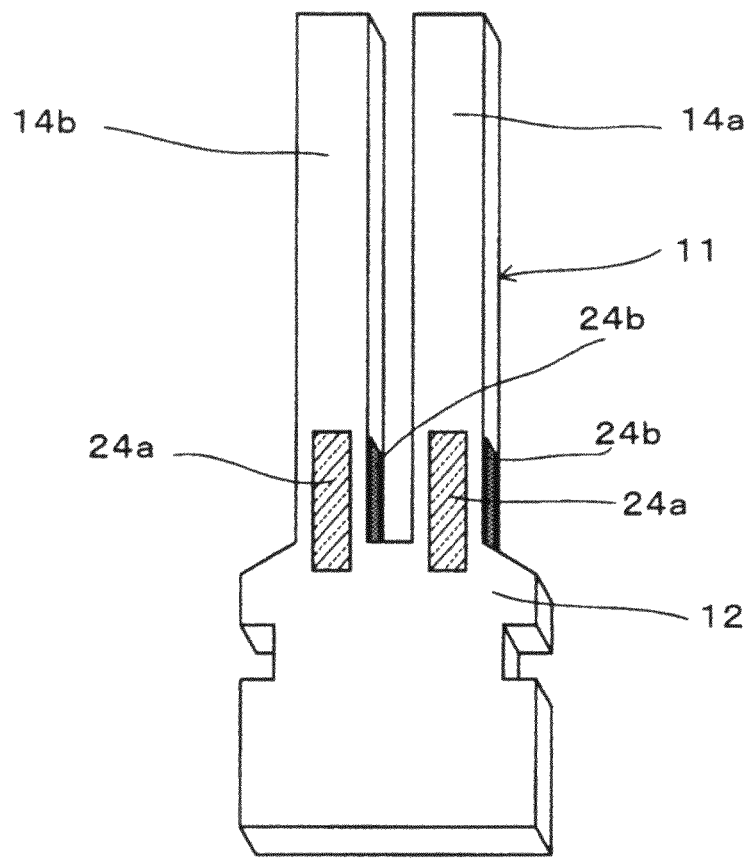
FIG. 6 is a diagram showing a characteristic part of a vibrating element according to a third embodiment.

A vibrating element according to a third embodiment will now be described with reference to FIG. 6. A structure of the vibrating element according to the present embodiment is mostly same as that of the vibrating element according to the first and second embodiments described above. Therefore, elements having the same functions as those shown in FIGS. 1A and 18 are given the same reference numerals and detailed descriptions thereof are not repeated. Further, FIG. 6 does not show the metal film which is shown in FIGS. 1A and 113.

The vibrating element 10 according to the third embodiment has a feature at disposing ranges of the temperature characteristic correcting parts 24a and 24b. Concretely, the vibrating element 10 of the present embodiment is provided with Cr or an alloy mainly containing Cr, of which the temperature characteristic correcting parts 24a and 24b are made, only on parts, which deform most largely, of the vibrating arms 14a and 14b serving as bending parts.

Electric resistance of Cr is large, so that it is preferable that Cr be deposited as thin as possible when Cr is used as a contact metal. This is because a Q value of the vibrator can be set high when resistance of a resonance circuit is small. On the other hand, when the film thickness of Cr which has been conventionally used as a contact metal is set to be thick, the frequency temperature characteristic is improved.

In view of these events, the most effective structure for improving the Q value and the frequency temperature characteristic is disposing the temperature characteristic correcting parts 24a and 24b only on parts, which deform most largely, of the arms and providing a thin film made of Cr or an alloy mainly containing Cr on the rest parts of the arms. Accordingly, the temperature characteristic correcting parts 24a and 24b are disposed on a base 12 side, which deforms most largely, of the vibrating arms 14a and 14b in the tuning fork type vibrating element in the present embodiment.

Here, in a case where the electrode part (the excitation electrodes 18a and 18b, the extracted electrodes 20a and 20b, and the input output electrodes 22a and 22b) constituting the metal film is made of a material such as aluminum (Al) having excellent adhesiveness with quartz crystal of which the vibrating body 11 is made, a contact metal is not required to be formed. In such the case, the electrode part can be directly formed after the temperature characteristic correcting parts 24a and 24b are formed as shown in FIG. 6.

Fourth Embodiment

A vibrating element according to a fourth embodiment will now be described with reference to FIG. 7. Here, FIG. 7 only shows a section of a vibrating arm having a feature of the vibrating element of the present embodiment, and FIG. 1A is referred for other elements.

The vibrating element 10 according to the fourth embodiment has a feature at a disposing state of a temperature characteristic correcting part 28. Concretely, the temperature characteristic correcting part is formed as a base layer of the electrode part in the first to third embodiments. In contrast, the temperature characteristic correcting part 28 is disposed between one vibrating body 11a and the other vibrating body 1ib constituting the vibrating arm 14a (14b), as an intermediate layer.

Figure 7:
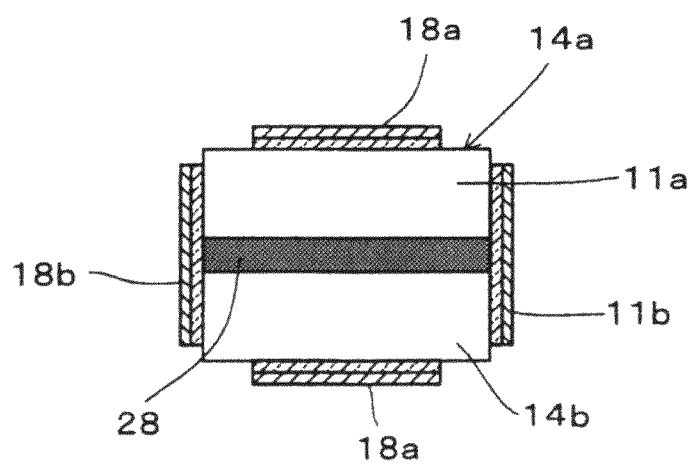
FIG. 7 is a diagram showing a structure of a vibrating arm which is a characteristic part of a vibrating element according to a fourth embodiment.

As shown in FIG. 7, the temperature characteristic correcting part 28 is interposed between the one vibrating body 11a and the other vibrating body 11b constituting the vibrating arms 14a and 14b in the vibrating element 10 in the present embodiment. In forming the vibrating arm, the temperature characteristic correcting part 28 is formed on a facing surface of one of the two vibrating bodies 11a and 11b which are thinned, the two vibrating bodies 11a and 11b are bonded to each other, and then the metal film 16 is formed on an outer surface of the bonded body.

The two vibrating bodies 11a an 11b may be bonded by direct bonding, metal bonding, or the like. Here, such a structure also may be adopted that only the vibrating arm 14a (14b) is thinned, the temperature characteristic correcting part 28 is formed on the vibrating arm 14a (14b) which is thinned, and a quartz crystal piece having the same shape as the vibrating arm 14a (14b) is bonded.

Even in the case where the temperature characteristic correcting part 28 formed on the one vibrating body 11a is sandwiched by the vibrating bodies 11a and 11b, the temperature characteristic correcting part fulfills the function so as to be able to improve the frequency temperature characteristic. Here, when the temperature characteristic correcting part is formed on the whole facing surface of the one vibrating body 11a or the other vibrating body 11b, an insulation film made of SiO$_2$ or the like is effectively formed on a circumference of the temperature characteristic correcting part so as to prevent short circuit.

In the above embodiments, the main vibration is flexural vibration and the vibrating element of the tuning fork type is used. However, the vibrating element is not limited to this.

Figure 8A:
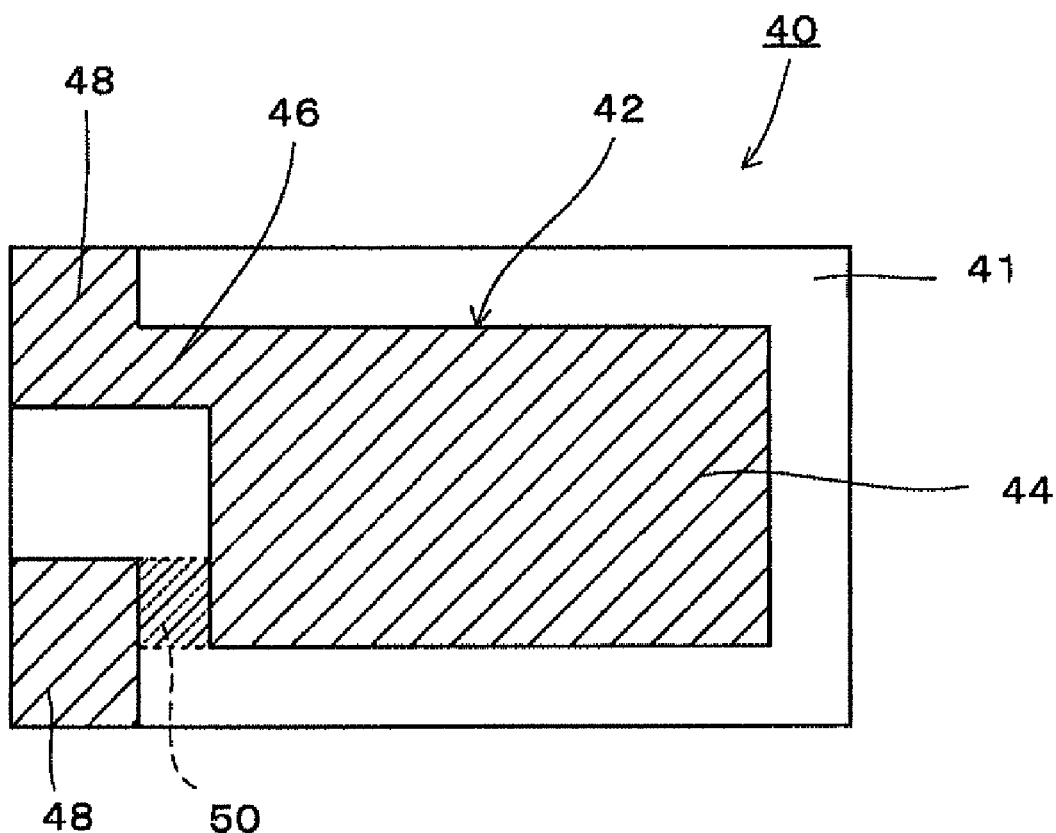
FIG. 8A is a plan view showing a vibrating element of which main vibration is thickness-sliding vibration.
Figure 8B:
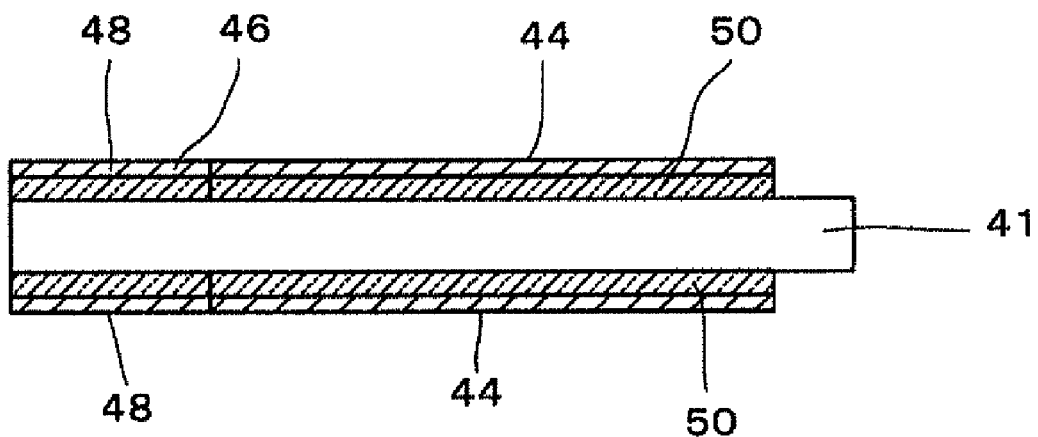
FIG. 8B is a sectional view of the same.

For example, when the main vibration is thickness-sliding vibration, a vibrating element shown in FIGS. 8A and 8B is preferably used. Concretely, the vibrating element is composed of a vibrating body 41, which has a planar shape and is cut out by a cutting angle which is called AT cut, and a metal film 42. The metal film 42 is composed of an electrode part and a temperature characteristic correcting part 50 serving as a base layer of the electrode part. The electrode part can be separated into an excitation electrode 44, an input output electrode 48, and an extracted electrode 46. The excitation electrode 44 is disposed on front and rear surfaces, corresponding to main surfaces, of the vibrating body 41 with the correcting part 50 interposed. Further, the temperature characteristic correcting part 50 may be formed as a base layer only on a part, on which the excitation electrode 44 constituting the electrode part is formed, of the vibrating body 41.

In a vibrating element 40 having such the structure, the temperature characteristic correcting part 50 is made of Cr or an alloy mainly containing Cr as is the case with the above embodiments. The electrode part is made of Au. In the vibrating element 40 having such structure, the temperature characteristic correcting part 50 formed on front and rear surfaces of the vibrating body 41 may be made of different materials of which Neel temperatures and Curie temperatures are different from each other.

Figure 9A:
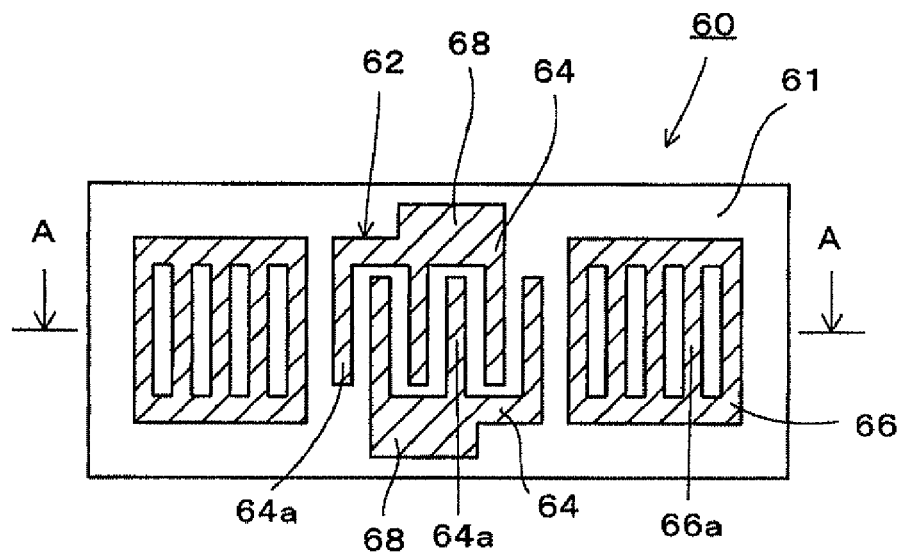
FIG. 9A is a plan view showing a first example of a vibrating element of which main vibration is surface acoustic wave.
Figure 9B:
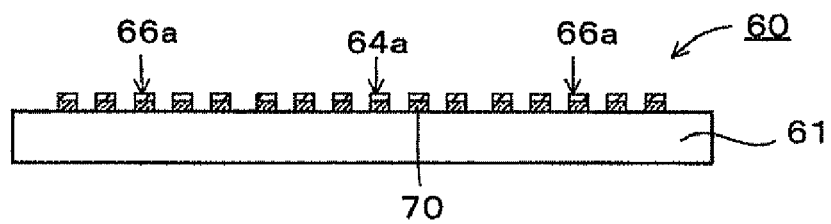
FIG. 9B is a sectional view taken along an A-A line of FIG. 9A.

In a case where the main vibration is surface acoustic wave, a vibrating element (a surface acoustic wave element chip) shown in FIGS. 9A and 9B may be used. FIG. 9A is a plan view of the surface acoustic wave element chip, and FIG. 9B is a sectional view taken along an A-A line of FIG. 9A.

A surface acoustic wave element chip 60 includes a vibrating body 61 which is an ST cut element chip, and a metal film 62 formed on one main surface of the vibrating body 61. The metal film 62 includes an IDT 64 as an excitation electrode, an input output electrode 68, and a reflector 66. In the metal film, a base layer is a temperature characteristic correcting part 70 made of Cr or an alloy mainly containing Cr, and a surface layer is made of Al.

Figure 10:
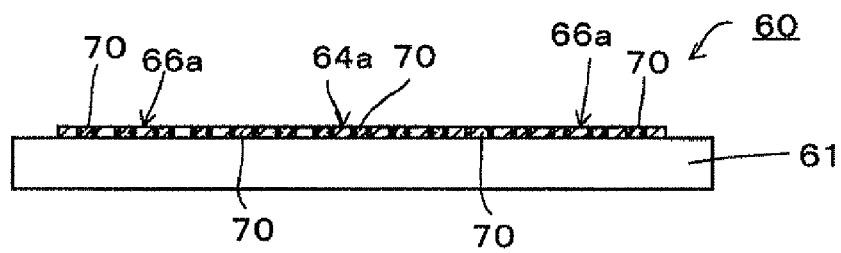
FIG. 10 is a diagram showing a second example of the vibrating element of which main vibration is surface acoustic wave.

As a second example of the surface acoustic wave element chip 60, the element chip shown in FIG. 10 may be used. Concretely, in the element chip 60 in FIG. 10, the IDT 64, the reflector 66, and the like are made of Al, and a film made of Cr or an alloy mainly containing Cr is disposed between electrode fingers 64a of the IDT 64 and between strips 66a in the reflector 66 so as to form the temperature characteristic correcting part 70. Here, a gap for preventing short circuit needs to be formed between the Cr film and the Al film.

Figure 11:
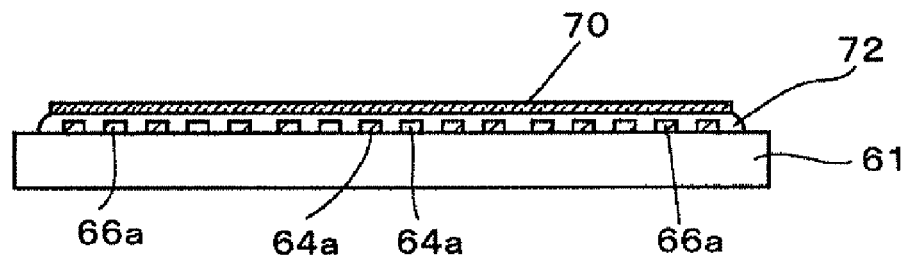
FIG. 11 is a diagram showing a third example of the vibrating element of which main vibration is surface acoustic wave.

As a third example of the surface acoustic wave element chip 60, the element chip of which a section is shown in FIG. 11 may be used. Concretely, the IDT 64, the reflector 66, and the like are made of Al, and a SiO$_2$ film 72 is formed on the metal film made of Al so as to prevent short circuit between the electrode fingers 64a. Then a film made of Cr or an alloy mainly containing Cr is formed on the SiO$_2$ film 72, thus providing the temperature characteristic correcting part 70. In such structure as well, change of compressive stress and extensile stress at a Neel temperature and a Curie temperature influences on the vibrating body 61 through the SiO$_2$ film 72, improving the frequency temperature characteristic.

In the structure of a vibrating element of which the main vibration is Lame-mode vibration which is a contour vibration, a quartz crystal piece cut out by a cutting angle of LQ1T cut or LQ2T cut is used as the vibrating body. When the vibrating element having such structure includes the metal film formed by the same state as that of the vibrating element of which the main vibration is thickness-sliding vibration, the invention is applicable to such the vibrating element.

The invention is applicable not only to the vibrating element having the above vibration mode as the main vibration but also to a vibrating element of which the main vibration is torsional vibration or boundary wave (Stoneley waves or Maerfield-Tournois waves) as long as a metal film is formed as above.

The vibrating body is made of quartz crystal in the above embodiments, but the vibrating body may be made of a piezoelectric substance or a semiconductor as long as the material offers the same advantageous effect in improving the frequency temperature characteristic as the above embodiments. Examples of the piezoelectric substance include lead zirconate titanate (PbZrTiO$_3$), lithium niobate (LiNbO$_3$), lithium tantalate (LiTaO$_3$), lithium triborate (LiB$_3$O$_5$), and potassium nitrate (KNO$_3$).

The temperature characteristic correcting part is made of Cr or an alloy mainly containing Cr in the above embodiments, but the correcting part may be made of other materials as long as a Curie temperature or a Neel temperature of the material is in an operating temperature range.

Fifth Embodiment

Figure 12:
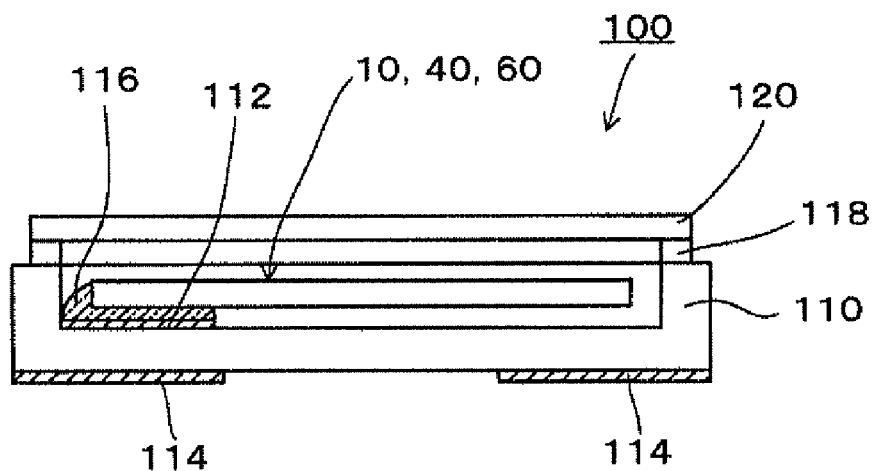
FIG. 12 is a sectional view showing a structure of a vibrator.

Hereinafter, a vibrator according to the invention will now be described with reference to FIG. 12.

A vibrator 100 according to a fifth embodiment mainly includes one of the vibrating elements 10, 40, and 60 described above, a package 110 housing the vibrating element 10 (40, or 60), and a lid 120 sealing an opening of the package 110.

The package 110 has a box-shaped body formed by layering ceramic green sheets and the like and baking the sheets, and an internal mounting electrode 112 for mounting the vibrating element 10 is formed in a cavity formed in a concave shape. On a bottom face at an exterior part of the package 110, an external mounting terminal 114 is formed. The external mounting terminal 114 is electrically connected with the internal mounting electrode 112 through a through hole or the like which is not shown.

The lid 120 has a flat plate shape in the present embodiment. The lid 120 is commonly made of metal or glass. In either case using metal or glass, it is preferable to use a material of which a linearly expansion coefficient is close to that of the material of the package 110.

The vibrating element 10 is mounted on the package 110 having the above mentioned structure. The vibrating element 10 is mounted by using a conductive adhesive 116. The conductive adhesive 116 is applied to the internal mounting electrode 112 so as to be bonded to the input output electrode of the vibrating element 10.

In sealing the opening of the package 110 on which the vibrating element 10 is mounted, the lid 120 is bonded to the package 110 with a bonding member 118 interposed. The material of the bonding member 118 changes depending on the material of the lid 120. For example, when the lid 120 is made of metal, a seal ring made of low melting point metal is used as the bonding member 118. On the other hand, when the lid is made of glass, the bonding member 118 is made of low melting point glass.

A vibrator having the above structure has an improved frequency temperature characteristic so as to exhibit high reliability in a large temperature range.

The entire disclosure of Japanese Patent Application No. 2009-033578, filed Feb. 17, 2009 is expressly incorporated by reference herein.

What is claimed is:

1. A vibrating element, comprising:
    a vibrating body having frequency temperature dependency; and
    a temperature characteristic correcting part provided on a surface of the vibrating body, the temperature characteristic correcting part having a temperature characteristic of at least one of a Young's modulus and a thermal expansion coefficient and being expressed by a temperature characteristic curve, the temperature characteristic curve having at least one of an inflection point and an extremal value, wherein
    a temperature of at least one of the inflection point and the extremal value is within an operating temperature range of the vibrating body, and
    the vibrating body includes two kinds of the temperature characteristic correcting parts that have different temperatures of at least one of the inflection point and the extremal value from each other.

2. The vibrating element according to claim 1, wherein the temperature of at least one of the inflection point and the extremal value is a Neel temperature.

3. The vibrating element according to claim 1, wherein the temperature characteristic correcting part is made of one of Cr and a Cr alloy.

4. The vibrating element according to claim 1, wherein the temperature difference is generated by a difference of thickness of metal films constituting the temperature correcting parts.

5. The vibrating element according to claim 1, wherein the temperature characteristic correcting parts are made of one of an alloy and a metal mainly contained in the alloy, and
    the temperature difference is generated by one of difference between a content rate of mainly-contained metal of the alloy and a content rate of other metal and difference between a thickness of the alloy and a thickness of the mainly contained metal of the alloy.

6. The vibrating element according to claim 1, wherein a main vibration of the vibrating body is a flexural vibration.

7. The vibrating element according to claim 1, wherein a main vibration of the vibrating body is a contour vibration.

8. The vibrating element according to claim 1, wherein an insulation film is interposed between the vibrating body and the temperature characteristic correcting part.

9. A vibrator, comprising: the vibrating element according to claim 1 and a package in which the vibrating element is mounted.

10. A vibrating element, comprising:
    a vibrating body having frequency temperature dependency: and
    a temperature characteristic correcting part provided on a surface of the vibrating body, the temperature characteristic correcting part having a temperature characteristic of at least one of a Young's modulus and a thermal expansion coefficient and being expressed by a temperature characteristic curve, the temperature characteristic curve having at least one of an inflection point and an extremal value, wherein
    a temperature of at least one of the inflection point and the extremal value is within an operating temperature range of the vibrating body, and
    one vibrating body is bonded to an upper surface of the temperature characteristic correcting part formed on a surface of the other vibrating body so as to sandwich the temperature characteristic correcting part by two pieces of temperature characteristic correcting parts.

* * * * *